(12) United States Patent
Son

(10) Patent No.: US 12,362,148 B2
(45) Date of Patent: Jul. 15, 2025

(54) APPARATUS FOR TREATING SUBSTRATE AND ASSEMBLY FOR DISTRIBUTING GAS

(71) Applicant: SEMES CO., LTD., Chungcheongnam-do (KR)

(72) Inventor: Hyoung Kyu Son, Seoul (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 618 days.

(21) Appl. No.: 17/564,281

(22) Filed: Dec. 29, 2021

(65) Prior Publication Data

US 2022/0208516 A1 Jun. 30, 2022

(30) Foreign Application Priority Data

Dec. 31, 2020 (KR) .................. 10-2020-0189443

(51) Int. Cl.
*H01J 37/32* (2006.01)
*C23C 16/455* (2006.01)
*C23C 16/46* (2006.01)

(52) U.S. Cl.
CPC .... *H01J 37/3244* (2013.01); *C23C 16/45565* (2013.01); *C23C 16/46* (2013.01); *H01J 37/32559* (2013.01)

(58) Field of Classification Search
None
See application file for complete search history.

(56) References Cited

U.S. PATENT DOCUMENTS 5,680,013 A * 10/1997 Dornfest ........... H01J 37/32495
315/111.21
6,036,782 A * 3/2000 Tanaka .................. C23C 16/455
118/715
(Continued)

FOREIGN PATENT DOCUMENTS

CN 101529558 A 9/2009
CN 106257637 A 12/2016
(Continued)

OTHER PUBLICATIONS

Machine Generation English English Translation of the BiB data of KR101686564. Published Dec. 15, 2016. (Year: 2016).*
(Continued)

*Primary Examiner* — Sylvia MacArthur
(74) *Attorney, Agent, or Firm* — Carter, DeLuca & Farrell LLP

(57) ABSTRACT

A gas distribution assembly provided in an apparatus for treating a substrate with plasma to distribute gas includes a gas distribution plate formed with a plurality of gas introduction holes for diffusing gas supplied from the gas supply unit; a shower head plate disposed at the upper portion or lower portion of the gas distribution plate to be in contact with the gas distribution plate and having a plurality of gas supply holes formed at positions communicating with the gas introduction holes to penetrate through the upper surface and the lower surface; and a fastening member provided at a side surface in contact with the gas distribution plate and the shower head plate and including a first coupling portion coupled to the gas distribution plate and a second coupling portion supporting the lower surface of the shower head plate to contact the gas distribution plate and the shower head plate.

20 Claims, 6 Drawing Sheets

(56) References Cited

U.S. PATENT DOCUMENTS

| | | | |
|---|---|---|---|
| 6,302,964 B1* | 10/2001 | Umotoy | C23C 16/45574 118/715 |
| 6,827,815 B2* | 12/2004 | Hytros | C23C 16/45565 156/345.32 |
| 7,854,820 B2 | 12/2010 | De La Llera | |
| 9,484,190 B2* | 11/2016 | Glukhoy | H01J 37/32091 |
| 10,475,626 B2* | 11/2019 | Collins | H01J 37/3233 |
| 2006/0213438 A1* | 9/2006 | Ishizaka | C23C 16/4404 118/715 |
| 2009/0179085 A1 | 7/2009 | Carducci | |
| 2010/0261354 A1* | 10/2010 | Bettencourt | H01J 37/16 29/402.02 |
| 2011/0048325 A1* | 3/2011 | Choi | C23C 16/45574 118/712 |
| 2015/0214009 A1 | 7/2015 | Glukhoy | |
| 2022/0208516 A1* | 6/2022 | Son | C23C 16/45565 |

FOREIGN PATENT DOCUMENTS

| | | |
|---|---|---|
| CN | 111627830 A | 9/2020 |
| JP | 2001-323377 A | 11/2001 |
| JP | 2010-507231 A | 3/2010 |
| KR | 10-0242897 B1 | 11/1999 |
| KR | 10-0718643 B1 | 5/2007 |
| KR | 10-0823881 B1 | 4/2008 |
| KR | 20110045631 A | 5/2011 |
| KR | 10-2011-0058534 A | 6/2011 |
| KR | 20110083832 A | 7/2011 |
| KR | 20150064324 A | 6/2015 |
| KR | 20-0478781 U | 11/2015 |
| KR | 10-1686564 B1 | 12/2016 |
| KR | 20180004474 A | 1/2018 |

OTHER PUBLICATIONS

Machine Generation English English Translation of the claims of KR101686564. Published Dec. 15, 2016. (Year: 2016).*
Machine Generation English English Translation of the description of KR101686564. Published Dec. 15, 2016. (Year: 2016).*
Machine Generation English English Translation of the description of KR100718643. Published May 9, 2007. (Year: 2007).*
Machine Generation English English Translation of the claims of KR100718643. Published May 9, 2007. (Year: 2007).*
Request for the Submission of an Opinion issued by the Korean Intellectual Property Office on Nov. 23, 2022 in corresponding KR Patent Application No. 10-2020-0189443, with English Translation.
Chinese Office Action issued by the China National Intellectual Property Administration on Mar. 14, 2025 in corresponding CN Patent Application No. 202111653081.1, with English translation.

* cited by examiner

APPARATUS FOR TREATING SUBSTRATE AND ASSEMBLY FOR DISTRIBUTING GAS

CROSS-REFERENCE TO RELATED APPLICATIONS

This application claims priority to and the benefit of the Korean Patent Application No. 10-2020-0189443 filed in the Korean Intellectual Property Office on Dec. 31, 2020, the entire contents of which are incorporated herein by reference.

TECHNICAL FIELD

The present invention relates to an apparatus for treating a substrate using plasma and a gas distribution assembly provided therein to distribute gas in a treating space.

BACKGROUND ART

Plasma is generated by a very high temperature, a strong electric field, or RF electromagnetic fields, and means an ionized gas condition consisting of ions, electrons, radicals and the like. A semiconductor device manufacturing process using the plasma may include etching, physical vapor deposition (PVD), chemical vapor deposition (CVD), ion implantation, and ashing processes. A process for treating a substrate such as a wafer or the like using the plasma is performed when ions and radical particles contained in the plasma collide with the wafer.

An exemplary embodiment of the manufacturing process of the semiconductor device using the plasma includes a step of supplying process gas to a treating chamber through a gas distribution assembly, wherein the process gas flows to a gap between a lower electrode provided to a support unit by which a semiconductor substrate is supported and an upper electrode provided above the semiconductor substrate; and a step of treating the semiconductor substrate to the treating chamber by applying RF power to either the lower electrode or the upper electrode and energizing the process gas in a plasma state.

A gas distribution assembly provided to a plasma treating apparatus is generally provided in a structure in which a gas distribution plate and a shower head plate are coupled by fastening of bolts. In this regard, Japanese Patent Publication No. 2001-323377 may be referred.

The structure in which the gas distribution plate and the shower head plate are fastened by bolts has a problem in that since a contact resistance generated by a difference in thermal expansion degree between the plates occurs and the heat transfer between the plates is not smooth due to a structural feature of the bolt fastening, the shower head plate is overheated during the process and thus, the substrate is over-etched.

SUMMARY OF THE INVENTION

An object of the present invention is to provide a gas distribution assembly and a substrate treating apparatus including the same capable of efficiently treating a substrate.

An object of the present invention is to provide a gas distribution assembly and a substrate treating apparatus including the same capable of solving a problem, such that intensive stress occurs by a difference in thermal expansion degree between a gas distribution plate and a shower head plate, and the like.

An object of the present invention is to provide a gas distribution assembly and a substrate treating apparatus including the same capable of maintaining adhesion between a gas distribution plate and a shower head plate as compared with the deformation of the shower head plate.

An object of the present invention is to provide a gas distribution assembly and a substrate treating apparatus including the same capable of smoothing the heat transfer between a gas distribution plate and a shower head plate by maintaining adhesion between the gas distribution plate and the shower head plate despite the thermal deformation.

Other objects of the present invention are not limited to the objects described above, and other objects, which are not mentioned above, will be apparent to those skilled in the art from the following description.

An exemplary embodiment of the present invention provides an apparatus for treating a substrate. In the exemplary embodiment, the apparatus for treating the substrate includes a chamber configured to have a treating space therein; a support unit configured to support the substrate in the treating space; a gas supply unit configured to supply gas to the treating space; a plasma source configured to generate plasma from the gas; and a gas distribution assembly disposed above the support unit, wherein the gas distribution assembly includes a gas distribution plate formed with a plurality of gas introduction holes for diffusing the gas supplied from the gas supply unit; a shower head plate disposed at the upper portion or lower portion of the gas distribution plate to be in contact with the gas distribution plate and having a plurality of gas supply holes formed at positions communicating with the gas introduction holes to penetrate through the upper surface and the lower surface; and a fastening member provided at a side surface in contact with the gas distribution plate and the shower head plate and including a first coupling portion coupled to the gas distribution plate and a second coupling portion supporting the lower surface of the shower head plate to contact the gas distribution plate and the shower head plate.

In the exemplary embodiment, the gas distribution plate and the shower head plate may be provided with materials having different thermal expansion coefficients.

In the exemplary embodiment, the gas distribution plate may be provided with a material containing metal, and the shower head plate may be provided with a material which reacts with plasma generated from the gas supplied by the gas supply unit to generate a compound.

In the exemplary embodiment, the fastening member may be provided with metal or ceramic or engineering plastic having elasticity and heat resistance.

In the exemplary embodiment, the gas distribution plate and the first coupling portion of the fastening member may be screwed to each other.

In the exemplary embodiment, the gas introduction holes of the gas distribution plate and the gas supply holes communicating with the gas introduction holes in the shower head plate may be provided at communicating positions even in deformation due to the thermal expansion of the gas distribution plate and the shower head plate generated according to the substrate process.

In the exemplary embodiment, the diameter of the gas introduction hole may be provided greater than the diameter of the gas supply hole.

In the exemplary embodiment, the plurality of gas supply holes may communicate with one of the plurality of gas introduction holes.

In the exemplary embodiment, the apparatus for treating the substrate may further include a ring-shaped cover member located on the lower surface of the fastening member to cover a surface where the fastening member is exposed to the treating space.

In the exemplary embodiment, a plurality of fastening members may be provided in a size corresponding to a part of the side surface of the gas distribution assembly and may be coupled with the gas distribution plate and the shower head plate at a plurality of positions.

In the exemplary embodiment, the apparatus for treating the substrate may further include a heat transfer member provided between the gas distribution plate and the shower head plate and provided in a shape corresponding to the lower surface of the gas distribution plate or the upper surface of the shower head plate, wherein the heat transfer member may be provided with a silicon material containing ceramic and/or a silicon material containing metal.

In the exemplary embodiment, in the gas distribution plate, a surface in contact with the shower head plate may be formed as any one of a concave surface and a convex surface, and in the shower head plate, a surface in contact with the gas distribution plate may be formed as the other surface of the concave surface and the convex surface.

An exemplary embodiment of the present invention provides a gas distribution assembly provided in an apparatus for treating a substrate with plasma to distribute gas.

In the exemplary embodiment, the gas distribution assembly includes a gas distribution plate formed with a plurality of gas introduction holes for diffusing the gas supplied from the gas supply unit; a shower head plate disposed at the upper portion or lower portion of the gas distribution plate to be in contact with the gas distribution plate and having a plurality of gas supply holes formed at positions communicating with the gas introduction holes to penetrate through the upper surface and the lower surface; and a fastening member provided at a side surface in contact with the gas distribution plate and the shower head plate and including a first coupling portion coupled to the gas distribution plate and a second coupling portion supporting the lower surface of the shower head plate to contact the gas distribution plate and the shower head plate.

In the exemplary embodiment, the gas distribution plate and the shower head plate may be provided with materials having different thermal expansion coefficients.

In the exemplary embodiment, the gas distribution plate may be provided with a material containing metal, and the shower head plate may be provided with a material which reacts with plasma generated from the gas supplied by the gas supply unit to generate a compound.

In the exemplary embodiment, the fastening member may be provided with metal or ceramic or engineering plastic having elasticity and heat resistance.

In the exemplary embodiment, the gas distribution plate and the first coupling portion of the fastening member may be screwed to each other.

In the exemplary embodiment, the gas introduction holes of the gas distribution plate and the gas supply holes communicating with the gas introduction holes in the shower head plate may be provided at communicating positions even in deformation due to the thermal expansion of the gas distribution plate and the shower head plate generated according to the substrate process.

In the exemplary embodiment, the diameter of the gas introduction hole may be provided greater than the diameter of the gas supply hole.

In the exemplary embodiment, the plurality of gas supply holes may communicate with one of the plurality of gas introduction holes.

In the exemplary embodiment, a plurality of fastening members may be provided in a size corresponding to a part of the side surface of the gas distribution assembly and may be coupled with the gas distribution plate and the shower head plate at a plurality of positions.

In the exemplary embodiment, the apparatus for treating the substrate may further include a heat transfer member provided between the gas distribution plate and the shower head plate and provided in a shape corresponding to the lower surface of the gas distribution plate or the upper surface of the shower head plate, wherein the heat transfer member may be provided with a silicon material containing ceramic and/or a silicon material containing metal.

In the exemplary embodiment, in the gas distribution plate, a surface in contact with the shower head plate may be formed as any one of a concave surface and a convex surface, and in the shower head plate, a surface in contact with the gas distribution plate may be formed as the other surface of the concave surface and the convex surface.

Another exemplary embodiment of the present invention provides an apparatus for treating a substrate. The apparatus for treating the substrate includes a chamber configured to have a treating space therein; a support unit configured to support the substrate in the treating space; a gas supply unit configured to supply gas to the treating space; a plasma source configured to generate plasma from the gas; and a gas distribution assembly disposed above the support unit, wherein the gas distribution assembly includes a gas distribution plate provided with a metallic material, configured to diffuse the gas supplied from the gas supply unit, and formed with a plurality of gas introduction holes having greater diameters than the gas supply holes; a shower head plate provided with a material containing silicon, disposed at the lower portion of the gas distribution plate to be in contact with the gas distribution plate, and having a plurality of gas supply holes formed at positions communicating with the gas introduction holes to penetrate through the upper surface and the lower surface; and a fastening member provided on a side surface in contact with the gas distribution plate and the shower head plate, provided with metal or ceramic or engineering plastic having elasticity and heat resistance, and including a first coupling portion screwed with the gas distribution plate, a second coupling portion supporting the lower surface of the shower head plate, and a connection portion connecting the first coupling portion and the second coupling portion to contact the gas distribution plate and the shower head plate, wherein the gas introduction holes of the gas distribution plate and the gas supply holes communicating with the gas introduction holes in the shower head plate are provided at communicating positions even in deformation due to the thermal expansion of the gas distribution plate and the shower head plate generated according to the substrate process.

According to various exemplary embodiments of the present invention, it is possible to efficiently treat a substrate.

According to various exemplary embodiments of the present invention, it is possible to solve a problem, such that intensive stress occurs by a difference in thermal expansion degree between a gas distribution plate and a shower head plate, and the like.

According to various exemplary embodiments of the present invention, it is possible to maintain adhesion between a gas distribution plate and a shower head plate as compared with the deformation of the shower head plate.

According to various exemplary embodiments of the present invention, it is possible to smooth the heat transfer between a gas distribution plate and a shower head plate by maintaining adhesion between the gas distribution plate and the shower head plate despite the thermal deformation.

The effect of the present invention is not limited to the foregoing effects, and non-mentioned effects will be clearly understood by those skilled in the art from the present specification and the accompanying drawings.

DETAILED DESCRIPTION

Figure 1:
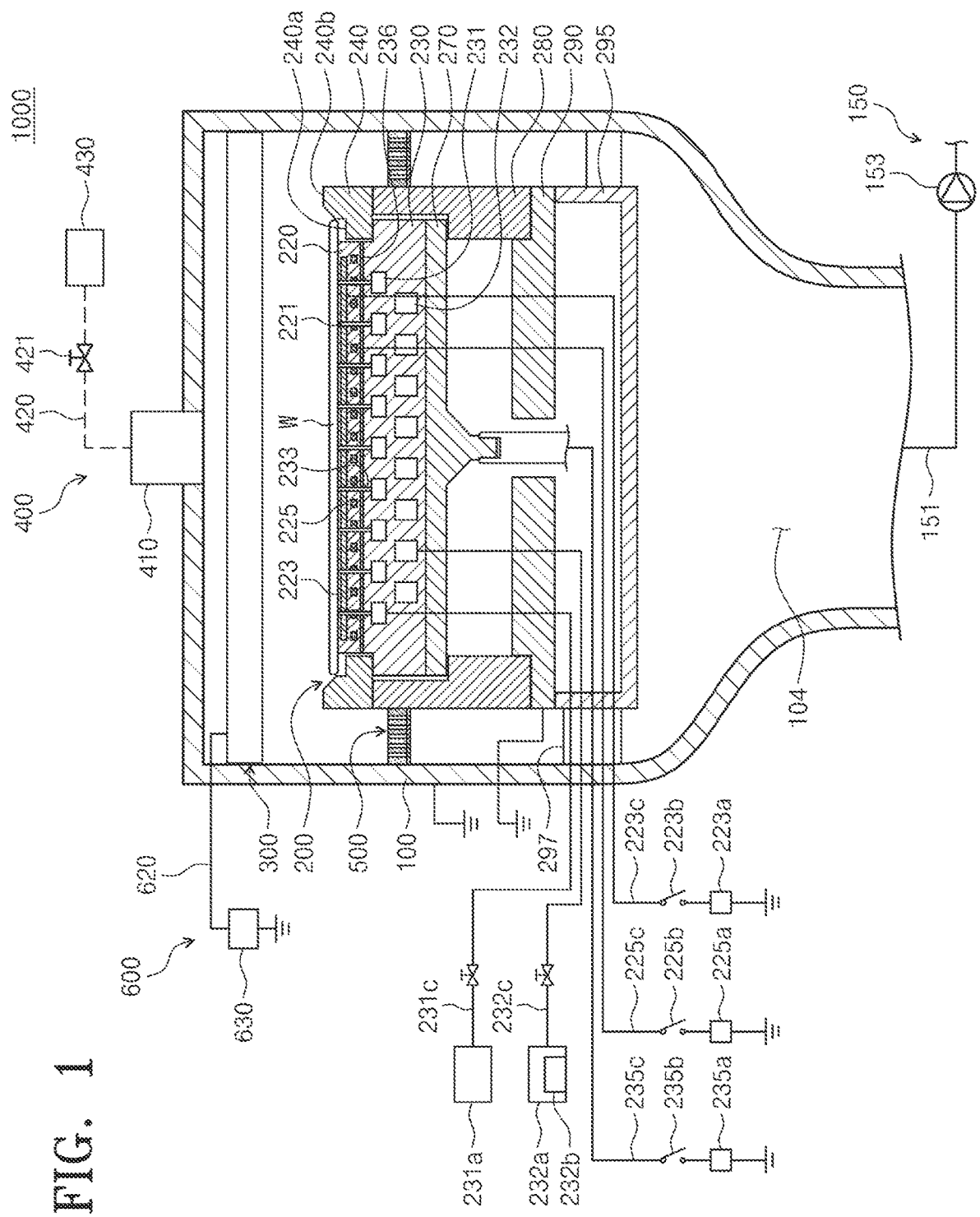
FIG. 1 is a cross-sectional view schematically illustrating a substrate treating apparatus according to an exemplary embodiment of the present invention.

Hereinafter, an exemplary embodiment of the present invention will be described more fully hereinafter with reference to the accompanying drawings, in which exemplary embodiments of the invention are shown. However, the present invention can be variously implemented and is not limited to the following exemplary embodiments. In the following description of the present invention, a detailed description of known functions and configurations incorporated herein is omitted to avoid making the subject matter of the present invention unclear. In addition, the same reference numerals are used throughout the drawings for parts having similar functions and actions.

Unless explicitly described to the contrary, the term of "including" any component will be understood to imply the inclusion of stated elements but not the exclusion of any other elements. It will be appreciated that terms "including" and "having" are intended to designate the existence of characteristics, numbers, steps, operations, constituent elements, and components described in the specification or a combination thereof, and do not exclude a possibility of the existence or addition of one or more other characteristics, numbers, steps, operations, constituent elements, and components, or a combination thereof in advance.

Singular expressions used herein include plurals expressions unless they have definitely opposite meanings in the context. Accordingly, shapes, sizes, and the like of the elements in the drawing may be exaggerated for clearer description.

The exemplary embodiment of the present invention can be modified in various forms, and it should not be construed that the scope of the present invention is limited to exemplary embodiments described below. The exemplary embodiments are provided to more completely describe the present invention to those skilled in the art. Therefore, shapes, and the like of components in the drawings will be exaggerated to emphasize a more clear description.

In an exemplary embodiment of the present invention, a substrate treating apparatus of etching the substrate using plasma will be described. However, the present invention is not limited thereto, and is applicable to various types of devices for performing a process by supplying plasma in a chamber.

FIG. 1 is a cross-sectional view schematically illustrating a substrate treating apparatus according to an exemplary embodiment of the present invention. Referring to FIG. 1, a substrate treating apparatus 1000 treats a substrate W using plasma. The substrate treating apparatus 1000 may perform an etching process for removing a film formed on the substrate W using the plasma. Unlike this, the substrate treating apparatus 1000 may perform an ashing process for removing a photoresist film using the plasma. However, it is not limited thereto, and the substrate treating apparatus 1000 may be used in various treating processes of treating the substrate W using the plasma.

The substrate treating apparatus 1000 may include a chamber 100, a support unit 200, a gas distribution assembly 300, a gas supply unit 400, a plasma source, a liner unit (not illustrated), an exhaust baffle 500, and a controller (not illustrated).

The chamber 100 may provide a treating space in which a substrate treating process is performed therein. The chamber 100 is provided in a sealed shape. The chamber 100 may be provided with a conductive material. For example, the chamber 100 may be provided with a material containing metal. For example, the chamber 100 may be provided with an aluminum material. The chamber 100 may be grounded. An exhaust hole 104 is formed in the bottom surface of the chamber 100. The exhaust hole 104 is connected with an exhaust line 151. The exhaust line 151 is connected with a pump 153. Reaction by-products generated in the processing process and gas left in the inner space of the chamber 100 may be discharged to the outside via the exhaust line 151. The inside of the chamber 100 may be decompressed in a predetermined pressure by the exhaust process. Unlike this, a separate decompression member is provided to reduce the inside of the treating space 102 at a predetermined pressure.

The chamber 100 may be provided with a heater (not illustrated). For example, a heater (not illustrated) may be provided to the wall of the chamber 100. The heater may heat the chamber 100. The heater may be electrically connected to a heating power supply (not illustrated). The heater may generate heat by resisting a current applied to the heating power supply. The heat generated in the heater is transmitted to an inner space. The treating space is maintained at a predetermined temperature by the heat generated in the heater. The heater may be provided as a coil-shaped hot wire. A plurality of heaters may be provided in the chamber 100. The heater may be provided as a coil-shaped hot wire. However, it is not limited thereto, and the heater may be variously modified to known devices capable of heating the chamber 100.

The support unit 200 is located inside the chamber 100. The support unit 200 supports the substrate W in the treating space. The support unit 200 may include an electrostatic chuck ESC for adsorbing the substrate W using an electrostatic force. Unlike this, the substrate support unit 200 may also support the substrate W in various methods such as mechanical clamping. Hereinafter, the support unit 200 including the electrostatic chuck ESC will be described.

The support unit 200 includes a dielectric plate 220, a body plate 230, a focus ring 240, an RF support plate 270, an insulating cover 280, a ground member 290, and a lower cover 295. The support unit 200 may be located to be spaced apart upward from the bottom surface of the chamber 100 inside the chamber 100.

The dielectric plate 220 is located at the upper end of the support unit 200. The dielectric plate 220 may be provided as a disk-shaped dielectric substance. The substrate W is disposed on the upper surface of the dielectric plate 220. The upper surface of the dielectric plate 220 has a radius smaller than the substrate W. Thus, an edge region of the substrate W is located outside the dielectric plate 220. A first supply flow channel 221 is formed in the dielectric plate 220. The first supply flow channel 221 may be provided to a lower surface from the upper surface of the dielectric plate 220. A plurality of first supply flow channels 221 may be spaced apart from each other, and may be provided as a passage to which a heat transfer medium is supplied to the lower surface of the substrate W.

An electrostatic electrode 223 and a heater 225 are embedded in the dielectric plate 220. The electrostatic electrode 223 is located on the heater 225. The electrostatic electrode 223 is electrically connected with a first lower power supply 223a. The first lower power supply 223a includes a DC power supply. A switch 223b is provided between the electrostatic electrode 223 and the first lower power supply 223a. The electrostatic electrode 223 may be electrically connected with the first lower power supply 223a by ON/OFF of the switch 223b. When the switch 223b is turned ON, a direct current is applied to the electrostatic electrode 223. The electrostatic force is applied between the electrostatic electrode 223 and the substrate W by the current applied to the electrostatic electrode 223, and the substrate W may be adsorbed and/fixed onto the dielectric plate 220 by the electrostatic force.

The heater 225 may be electrically connected with a second lower power supply 225a. The heater 225 may generate heat by resisting the current applied to the second lower power supply 225a. The generated heat is transmitted to the substrate W through the dielectric plate 220. The substrate W may be maintained at a predetermined temperature by the heat generated in the heater 225. The heater 225 may include a spiral coil.

A body plate 230 is located below the dielectric plate 220. The lower surface of the dielectric plate 220 and the upper surface of the support plate 230 may adhere to each other by an adhesive 236.

The body plate 230 may be provided with an aluminum material. The upper surface of the body plate 230 may be stepped so that the central region is higher than the edge region. The central region of the upper surface of the body plate 230 has an area corresponding to the lower surface of the dielectric plate 220 and may adhere to the lower surface of the dielectric plate 220. The body plate 230 may be formed with a first circulation flow channel 231, a second circulation flow channel 232, and a second supply flow channel 233.

The body plate 230 may include a metal plate. The body plate 230 may function as an electrode for receiving power from the power supply. Meanwhile, in FIG. 1, the substrate treating apparatus 1000 is constituted by a CCP type, but is not limited thereto, and the substrate treating apparatus 1000 according to an exemplary embodiment of the present invention may be configured as an ICP type.

The first circulation flow channel 231 may be provided as a passage for circulating a heat transfer medium. The first circulation flow channel 231 may be formed in a spiral shape inside the body plate 230. Alternatively, the first circulation flow channel 231 may be disposed so that ring-shaped flow channels having different radii have the same center. The respective first circulation flow channels 231 may communicate with each other. The first circulation flow channels 231 are formed at the same height.

The second circulation flow channel 232 may be provided as a passage for circulating a cooling fluid. The second circulation flow channel 232 may be formed in a spiral shape inside the body plate 230. Alternatively, the second circulation flow channel 232 may be disposed so that ring-shaped flow channels having different radii have the same center. The respective second circulation flow channels 232 may communicate with each other. The second circulation flow channel 232 may have a cross-sectional area greater than the first circulation flow channel 231. The second circulation flow channels 232 are formed at the same height. The second circulation flow channel 232 may be located below the first circulation flow channel 231.

The second supply flow channel 233 extends upward from the first circulation flow channel 231 and is provided to the upper surface of the support plate 230. The second supply flow channels 243 are provided in the number corresponding to the first supply flow channels 221, and may connect the first circulation flow channel 231 and the first supply flow channel 221 to each other.

The first circulation flow channel 231 may be connected with a heat transfer medium storage unit 231a via a heat transfer medium supply line 231b. A heat transfer medium may be stored in the heat transfer medium storage unit 231a. The heat transfer medium includes inert gas. According to the exemplary embodiment, the heat transfer medium includes helium (He) gas. The helium gas is supplied to the first circulation flow channel 231 through the supply line 231b, and may be supplied to the lower surface of the substrate W sequentially through the second supply flow channel 233 and the first supply flow channel 221. The helium gas may serve as a medium for transmitting the heat transmitted to the substrate W to the electrostatic chuck in the plasma.

The second circulation flow channel 232 is connected with a cooling fluid storage unit 232a via a cooling fluid supply line 232c. A cooling fluid is stored in the cooling fluid storage unit 232a. A cooler 232b may be provided in the cooling fluid storage unit 232a. The cooler 232b cools the cooling fluid to a predetermined temperature. Unlike this, the cooler 232b may be provided on the cooling fluid supply line 232c. The cooling fluid supplied to the second circulation flow channel 232 through the cooling fluid supply line 232c may circulate along the second circulation flow channel 232 and cool the support plate 230. The support plate 230 may cool the dielectric plate 220 and the substrate W together while cooling to maintain the substrate W at a predetermined temperature.

The focus ring 240 is disposed in the edge region of the electrostatic chuck. The focus ring 240 has a ring shape and is disposed along the circumference of the dielectric plate 220. Further, the focus ring 240 may be disposed on the upper surface of the insulating cover 280. The upper surface of the focus ring 240 may be stepped so that an outer portion 240a is higher than an inner portion 240b. The inner portion 240b of the upper surface of the focus ring 240 may be located at the same height as the upper surface of the dielectric plate 220. The inner portion 240b of the upper surface of the focus ring 240 may support the edge region of the substrate W located outside the dielectric plate 220. The outer portion 240a of the focus ring 240 is provided to surround the edge region of the substrate W. The focus ring 240 allows the plasma to be concentrated in the area facing the substrate W in the chamber 100.

An air gap 285 is formed at the lower portion of the body plate 230. More specifically, the air gap 285 is formed between the RF support plate 270 and the ground member 290 to be described below. The air gap 285 may be covered by the insulating cover 280. The air gap 285 electrically insulates the RF support plate 270 and the ground member 290 from each other.

The RF support plate 270 is provided below the body plate 230. The upper surface of the RF support plate 270 is provided in contact with the lower surface of the body plate 230. The RF support plate 270 functions as an extension portion of the body plate 230 below the body plate 230. The planar surface of the RF support plate 270 may be provided in a disk shape. The RF support plate 270 is provided with a conductive material. For example, the RF support plate 270 may be provided with an aluminum material. The RF support plate 270 and the body plate 230 may be combined with each other to function as a lower electrode of the support unit 200.

The RF support plate 270 includes an electrode plate portion 271, a deformation portion 272, and a load coupling portion 273. The planar surface of the electrode plate portion 271 is provided in a shape corresponding to the planar shape of the body plate 230. The deformation portion 272 is formed by extending to the lower portion from the center of the electrode plate portion 271. The deformation portion 272 may be formed so that the diameter is decreased downward. The load coupling portion 273 is formed by extending from the lower portion of the deformation portion 272. In the exemplary embodiment, the body plate 230 and the RF support plate 270 are provided as separate components, but may be one component provided with a conductive material.

A power supply rod 275 may apply power to the RF support plate 270. The power supply rod 275 may be electrically connected to the RF support plate 270. The power supply rod 275 may be connected with a lower power supply 227. The lower power supply 227 may be provided as an RF power supply for generating RF power. The RF power supply may be provided as a high bias power RF power supply. The lower power supply 227 may be provided as a plurality of RF power supplies. The plurality of RF power supplies may be constituted in any one combination of a high frequency (27.12 MHz or more), a medium frequency (1 MHz to 27.12 MHz) and a low frequency (100 kHz to 1 MHz). The power supply rod 275 may receive high frequency power from the lower power supply 227. The power supply rod 275 may be provided with a conductive material. For example, the power supply rod 275 may be provided with a material containing metal. The power supply rod 275 may be a metal rod. Further, the power supply rod 275 may be connected to a matcher (not illustrated). The third lower power supply 235a and the power supply rod 275 may be connected to each other through the matcher (not illustrated). The matcher (not illustrated) may perform impedance matching.

The insulating cover 280 supports the RF support plate 270. The insulating cover 280 may be provided to be in contact with the side surface of the RF support plate 270. The insulating cover 280 may be provided to be in contact with the edge region of the lower surface of the RF support plate 270. For example, the insulating cover 280 may have a cylindrical shape with opened upper and lower portions. In addition, the inside of the insulating cover 280 may be stepped so that the RF support plate 270 may be supported by the insulating cover 280. The insulating cover 280 may be provided with an insulating material.

The ground member 290 is an electrically grounded configuration. A through hole through which the power supply rod 275 penetrates is formed in the ground member 290. The through hole through which the power supply rod 275 penetrates may be formed at the center of the ground member 290.

The lower cover 295 is located at the lower end of the substrate support unit 200. The lower cover 295 is located to be spaced apart upward from the lower surface of the chamber 100. The lower cover 295 has a space having an opened upper surface therein. The upper surface of the lower cover 295 is covered by the ground member 290. Accordingly, an outer radius of the cross-section of the lower cover 295 may be provided with the same length as the outer radius of the ground member 290. In the inner space of the lower cover 295, a lift pin module (not illustrated) or the like may be located to move the conveyed substrate W from an outer conveying member to a support surface of the substrate W corresponding to the upper surface of the support unit 200.

The lower cover 295 includes a connection member 297. The connection member 297 may connect an outer surface of the lower cover 295 with an inner wall of the chamber 100. A plurality of connection members 297 may be provided on the outer surface of the lower cover 295 at regular intervals. The connection member 297 supports the substrate support unit 200 in the chamber 100. In addition, the connection member 297 is connected with the inner wall of the chamber 100 so that the lower cover 295 is electrically grounded. A first power supply line 223c connected with the first lower power supply 223a, a second power supply line 225c connected with the second lower power supply 225a, the heat transfer medium supply line 231b connected with the heat transfer medium storage unit 231a, the cooling fluid supply line 232c connected with the cooling fluid storage unit 232a, and the like extend to the inside of the lower cover 295 through the inner space of the connection member 297.

The lower cover 295 is disposed below the insulating cover 280. The lower cover 295 is disposed below the insulating cover 280 to support the insulating cover 280. In addition, the lower cover 295 may be provided with a conductive material. For example, the lower cover 295 may be provided with a material containing metal. For example, the lower cover 295 may be electrically connected with the chamber 100. The lower cover 295 may be electrically grounded.

The gas distribution assembly 300 may disperse the gas supplied to the gas distribution assembly 300. Further, the gas distribution assembly 300 may allow the gas supplied by the gas supply unit 400 to be uniformly supplied to the treating space.

Figure 2:
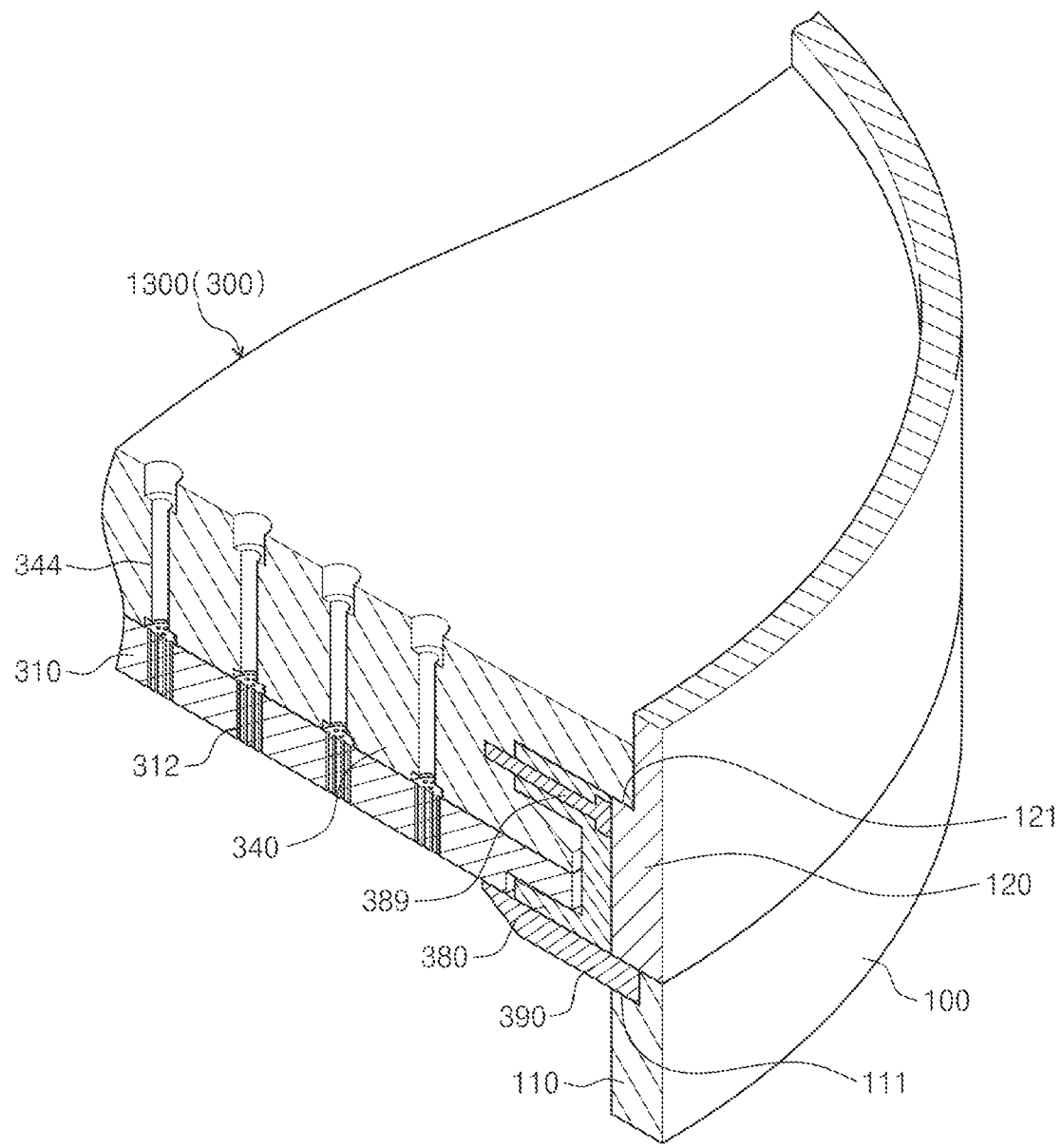
FIG. 2 is a cut perspective view schematically illustrating a gas distribution assembly according to an exemplary embodiment provided in FIG. 1.

FIG. 2 is a cut perspective view schematically illustrating a gas distribution assembly according to an exemplary embodiment provided in FIG. 1. A gas distribution assembly 1300 according to an exemplary embodiment of the present invention will be described with reference to FIG. 2 in addition to FIG. 1. The gas distribution assembly 1300 includes a shower head plate 310, and a gas distribution plate 340.

The shower head plate 310 is disposed below the gas distribution plate 340. The gas distribution assembly 1300 is located at the upper portion of the support unit 200. A predetermined space is formed between the shower head plate 310 and the upper portion of the support unit 200, and the space is defined as the treating space. The shower head plate 310 may be provided in a plate shape. The lower surface of the shower head plate 310 may be polarized to prevent arc occurrence by the plasma. The cross section of the shower head plate 310 may be provided to have the same shape as the support unit 200. The cross section of the shower head plate 310 may be provided to have a cross-sectional area which is equal to or greater than that of the support unit 200. A plurality of gas supply holes 312 is formed in the shower head plate 310. The plurality of gas supply holes 312 are uniformly formed across the entire area of the shower head plate 310. The positions at which the gas supply holes 312 are formed and the number of gas supply holes 312 may be appropriately designed to uniformly supply and treat gas and plasma to the entire area of the substrate W. The gas supply holes 312 may be formed through the upper surface and the lower surface of the shower head plate 310 in a vertical direction.

The shower head plate 310 may be provided with a material that reacts with the plasma generated from the gas supplied by the gas supply unit 400 to generate a compound. For example, the shower head plate 310 may be provided with a material that reacts with an ion having the largest electronegativity among ions included in the plasma to generate a compound. For example, the shower head plate 310 may be provided with a material containing silicon (Si).

The gas distribution plate 340 is disposed on the shower head plate 310. The gas distribution plate 340 is located to be spaced apart at a predetermined distance from the upper surface of the chamber 100. The gas distribution plate 340 may diffuse the gas supplied from the upper portion. The gas distribution plate 340 is formed with gas introduction holes 344. The gas introduction holes 344 are uniformly formed across the entire area of the gas distribution plate 340. The gas introduction holes 344 may be formed at positions corresponding to the gas supply holes 312. The gas introduction hole 344 may communicate with the gas supply hole 312. In the exemplary embodiment, the gas introduction hole 344 may communicate with the plurality of gas supply holes 312. The gas supplied from the upper portion of the gas distribution assembly 1300 may be supplied to the lower portion of the shower head plate 310 sequentially through the gas introduction holes 344 and the gas supply holes 312. The gas distribution plate 340 may include a metallic material. The gas distribution plate 340 may be electrically grounded or connected with an upper power supply 630. The gas distribution plate 340 may be grounded or connected with the upper power supply 630 to function as an upper electrode. In the exemplary embodiment, the upper portion of the gas distribution plate 340 may be provided with a larger diameter than the lower portion. On the upper portion of the gas distribution plate 340, a protrusion may be formed by a difference in diameter between the upper portion and the lower portion of the gas distribution plate 340. The gas distribution plate 340 may be supported to other configurations by the protrusion. In the exemplary embodiment, the gas distribution plate 340 may be supported to the upper wall 120 of the chamber 100. Although not illustrated in the drawing, the gas distribution plate 340 is provided to be electrically insulated from the upper wall 120 of the chamber 100. In another exemplary embodiment, the gas distribution plate 340 may be disposed to cover the circumference of the gas distribution assembly 1300 and may be covered and supported by an insulating ring provided in a ring shape.

Figure 3:
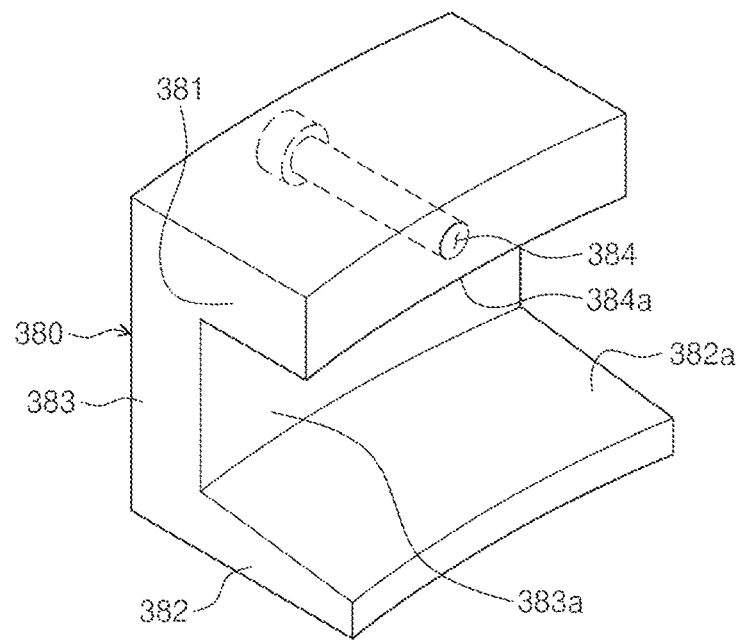
FIG. 3 is a perspective view illustrating a fastening member provided in the gas distribution assembly to couple a gas distribution plate and a shower head plate to each other.

The shower head plate 310 and the gas distribution plate 340 are coupled to each other by a fastening member 380. FIG. 3 is a perspective view illustrating the fastening member provided in the gas distribution assembly to couple the gas distribution plate and the shower head plate. The fastening member 380 according to the exemplary embodiment will be described with reference to FIG. 3 in addition to FIG. 2.

The fastening member 380 includes a first coupling portion 381, a second coupling portion 382 and a connection portion 383. The first coupling portion 381 is coupled in contact with the gas distribution plate 340. According to the exemplary embodiment, the first coupling portion 381 and the gas distribution plate 340 may be screw-coupled. The second coupling portion 382 is in contact with the shower head plate 310. An upper surface 382a of the second coupling portion 382 supports the shower head plate 310. The second coupling portion 382 may extend in a direction perpendicular to the connection portion 383 to be provided in a protruding form.

According to the exemplary embodiment, a lower surface 384a of the first coupling portion 381 is in contact with the gas distribution plate 340, the upper surface 382a of the second coupling portion 382 is in contact with the shower head plate 310, and the gas distribution plate 340 and the shower head plate 310 may be clamped and coupled by the first coupling portion 381 and the second coupling portion 382. The first coupling portion 381 and the second coupling portion 382 may be connected to each other by the connection portion 383.

The fastening member 380 may be provided in a size corresponding to a part of the side surface of the gas distribution assembly 1300. A plurality of fastening members 380 is provided along the circumference of the gas distribution assembly 1300 to couple the gas distribution plate 340 and the shower head plate 310 to each other. The number of fastening members 380 may be designed according to the required specifications.

The fastening member 380 is provided with a material with good elastic force and heat resistance. In the exemplary embodiment, the fastening member 380 may be provided as a metallic or a ceramic material or engineering plastic. The gas distribution plate 340 and the shower head plate 310 may be in close contact with each other by the elastic force of the fastening member 380. The shower head plate 310 allows the upper surface 382a of the second coupling portion 382 to be slidable on the surface in contact with the upper surface 382a of the second coupling portion 382. Despite the deformation that the shower head plate 310 is expanded by the heat occurs, the shower head plate 310 is supported to the upper surface 382a of the second coupling portion 382 to be in contact with the gas distribution plate 340 and be slidable on the contact surface between the upper surface 382a of the second coupling portion 382 and the gas distribution plate 340. Accordingly, despite the thermal deformation of the shower head plate 310, the contact state of the shower head plate 310 and the gas distribution plate 340 may be maintained. Meanwhile, even when the shower head plate 310 is expanded or contracted by the thermal deformation, it is preferred to design the positions and sizes of the gas supply holes 312 and the gas introduction holes 344 so as to be maintained while the gas supply holes 312 of the shower head plate 310 communicate with the gas introduction holes 344 of the gas distribution plates 340. In the exemplary embodiment, the diameter of the gas introduction hole 344 is provided greater than the diameter of the gas supply hole 312. In an additional exemplary embodiment, a resin material may be provided on the contact surface with the shower head plate 310 of the fastening member 380. The resin material is provided on the contact surface with the shower head plate 310 of the fastening member 380, so that smooth sliding may be made between the shower head plate 310 and the fastening member 380. The resin material may be provided as an engineering plastic material. In the exemplary embodiment, a cover member 390 may be positioned below the fastening member 380. The cover member 390 prevents the fastening member 380 from being exposed to a treatment environment of the substrate. The cover member 390 is formed in a ring shape and positioned between the treating space and the fastening member 380 to prevent the fastening member 380 from being exposed to the treating space. In the exemplary embodiment, the cover member 390 may be provided with a quartz material. In the exemplary embodiment, the cover member 390 may be supported on the wall of the chamber 100. For example, the cover member 390 may be supported by the lower chamber 110 that forms the chamber 100.

Figure 4:
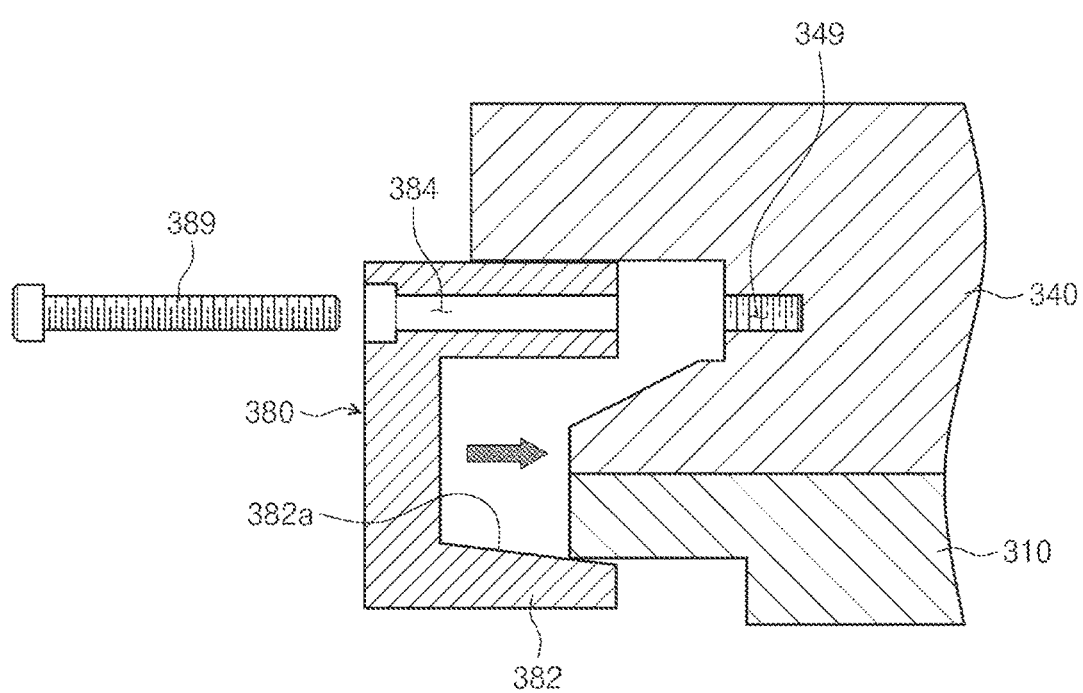
FIG. 4 is a diagram illustrating a method of coupling the gas distribution plate and the shower head plate using the fastening member.
Figure 5:
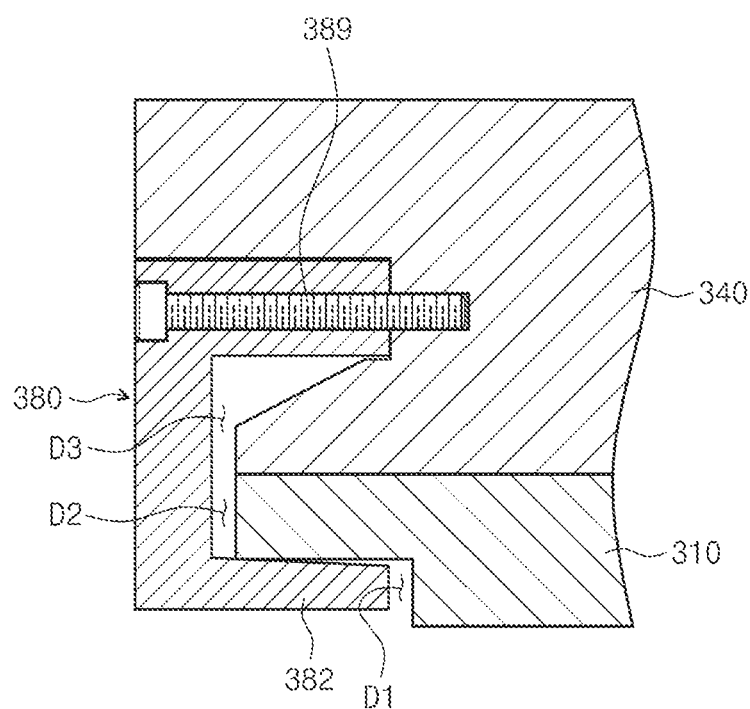
FIG. 5 is a partial cross-sectional view illustrating a state of coupling the gas distribution plate and the shower head plate using the fastening member.

FIG. 4 is a diagram illustrating a method of coupling the gas distribution plate and the shower head plate using the fastening member. FIG. 5 is a partial cross-sectional view illustrating a state of coupling the gas distribution plate and the shower head plate using the fastening member. A coupling method of the gas distribution plate 340 and the shower head plate 310 by the fastening member 380 according to an exemplary embodiment will be described with reference to FIGS. 4 and 5.

The gas distribution plate 340 may be formed with a screw groove 349 for screwing the fastening member 380. A coupling groove may be formed around the lower surface of the shower head plate 310. The upper surface of the shower head plate 310 is in close contact with the lower surface of the gas distribution plate 340, and the circumference of the upper surface of the shower head plate 310 may be equal to or similar to the circumference of the lower surface of the gas distribution plate 340. In the exemplary embodiment, the first coupling portion 381 of the fastening member 380 is inserted into the groove formed on the circumference of the gas distribution plate 340. The second coupling portion 382 of the fastening member 380 is inserted into the coupling groove formed around the lower surface of the shower head plate 310. The upper surface 382a of the second engaging portion 382 may be formed to be inclined upwardly toward the outside thereof. As the upper surface 382a of the second coupling portion 382 is inclined, the fastening member 380 is fastened to the shower head plate 310 to increase the contact degree between the gas distribution plate 340 and the shower head plate 310. The first coupling portion 381 of the fastening member 380 is screw-coupled with the gas distribution plate 340. The second coupling portion 382 of the fastening member 380 supports the shower head plate 310. The shower head plate 310 and the gas distribution plate 340 are in close contact with each other by the fastening member 380 to allow the deformation of the shower head plate 310 even if the gas distribution plate 340 and the shower head plate 310 are deformed by the heat, thereby maintaining the contact between the gas distribution plate 340 and the shower head plate 310.

In the exemplary embodiment, the inner surface of the second coupling portion 382 and the shower head plate 310 may be spaced apart from each other at a first distance D1. The connection portion 383 of the fastening member 380 and the shower head plate 310 may be spaced apart from each other at a second distance D2. The connection portion 383 of the fastening member 380 and the gas distribution plate 340 may be spaced apart from each other at a third distance D3. The fastening member 380 and the shower head plate 310 are spaced apart from each other at a predetermined distance in a lateral direction, so that the shower head plate 310 may increase an allowable limit for deformation in the lateral direction.

Figure 6:
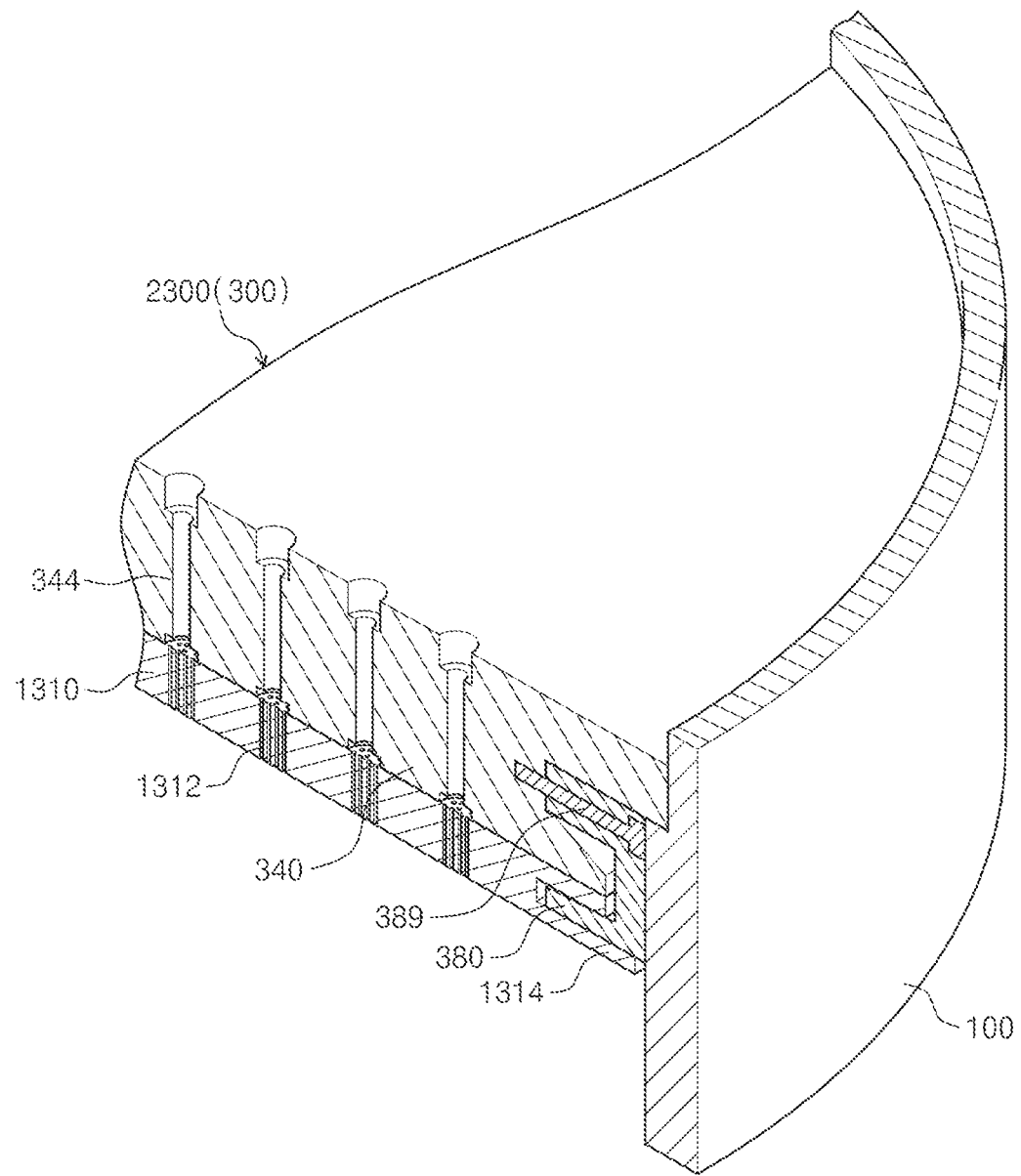
FIG. 6 is a cut perspective view schematically illustrating a gas distribution assembly according to another exemplary embodiment.

FIG. 6 is a cut perspective view schematically illustrating a gas distribution assembly according to another exemplary embodiment. Referring to FIGS. 6 and 1, a gas distribution assembly 2300 according to another exemplary embodiment will be described. In the description of the gas distribution assembly 2300 according to another exemplary embodiment, different configurations from the gas distribution assembly 1300 of the exemplary embodiment will be mainly described, but similar configurations to the gas distribution assembly 1300 of the exemplary embodiment are replaced with the description of FIGS. 2 to 5 and use the same reference numerals.

A shower head plate 1310 of the gas distribution assembly 2300 is disposed below the gas distribution plate 340. The gas distribution assembly 2300 is located at the upper portion of the support unit 200. A predetermined space is formed between the shower head plate 1310 and the upper portion of the support unit 200, and the space is defined as the treating space. The shower head 1310 may be provided in a plate shape with a constant thickness. The lower surface of the shower head plate 1310 may be polarized to prevent arc occurrence by the plasma. The cross section of the shower head plate 1310 may be provided to have the same shape as the support unit 200. The cross section of the shower head plate 1310 may be provided to have a cross-sectional area which is equal to or greater than that of the support unit 200. A plurality of gas supply holes 312 is formed in the shower head plate 1310. The gas supply holes 312 may be formed through the upper surface and the lower surface of the shower head plate 1310 in a vertical direction.

The shower head plate 1310 may be provided with a material that reacts with the plasma generated from the gas supplied by the gas supply unit 400 to generate a compound. For example, the shower head plate 1310 may be provided with a material that reacts with an ion having the largest electronegativity among ions included in the plasma to generate a compound. For example, the shower head plate 1310 may be provided with a material containing silicon (Si).

The gas distribution plate 340 is disposed on the shower head plate 1310. In the exemplary embodiment, the gas introduction hole 344 may communicate with a plurality of gas supply holes 1312. The gas supplied from the upper portion of the gas distribution assembly 2300 may be supplied to the lower portion of the shower head plate 1310 sequentially through the gas introduction holes 344 and the gas supply holes 1312.

The shower head plate 1310 and the gas distribution plate 340 are coupled to each other by the fastening member 380. In the exemplary embodiment, the lowest surface of the shower head plate 1310 may include an extension 1314 extending to cover the lower surface of the fastening member 380. The lowest surface of the shower head plate 1310 may cover the lower surface of the fastening member 380 to prevent the fastening member 380 from being exposed to the treating environment. In another exemplary embodiment, the cover member 390 provided in the exemplary embodiment may be further provided to increase a protective effect.

Figure 7:
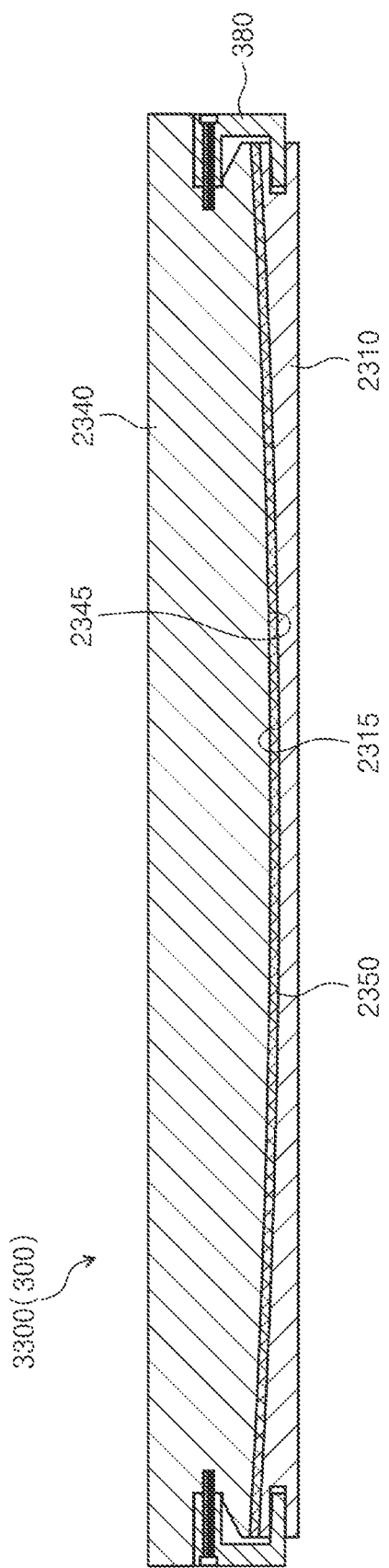
FIG. 7 is a cross-sectional view schematically illustrating a gas distribution assembly according to yet another exemplary embodiment.

FIG. 7 is a cross-sectional view schematically illustrating a gas distribution assembly according to yet another exemplary embodiment. Referring to FIGS. 7 and 1, a gas distribution assembly 3300 according to yet another exemplary embodiment will be described. In the description of the gas distribution assembly 3300 according to yet another exemplary embodiment, different configurations from the gas distribution assembly 1300 of the exemplary embodiment will be mainly described, but similar configurations to the gas distribution assembly 1300 of the exemplary embodiment are replaced with the description of FIGS. 2 to 5.

The gas distribution assembly 3300 includes a shower head plate 2310, and a gas distribution plate 2330.

The shower head plate 2310 is disposed below the gas distribution plate 2330. The gas distribution assembly 3300 is located at the upper portion of the support unit 200. A predetermined space is formed between the shower head plate 2310 and the upper portion of the support unit 200, and the space is defined as the treating space. The shower head plate 2310 may be provided in a plate shape with a constant thickness. The lower surface of the shower head plate 2310 may be polarized to prevent arc occurrence by the plasma. The cross section of the shower head plate 2310 may be provided to have the same shape as the support unit 200. The cross section of the shower head plate 2310 may be provided to have a cross-sectional area which is equal to or greater than that of the support unit 200. A plurality of gas supply holes 312 (see FIG. 2) is formed in the shower head plate 2310.

The shower head plate 2310 may be provided with a material that reacts with the plasma generated from the gas supplied by the gas supply unit 400 to generate a compound. For example, the shower head plate 2310 may be provided with a material that reacts with an ion having the largest electronegativity among ions included in the plasma to generate a compound. For example, the shower head plate 2310 may be provided with a material containing silicon (Si).

The gas distribution plate 2330 is disposed on the shower head plate 2310. The gas distribution plate 2330 is located to be spaced apart at a predetermined distance from the upper surface of the chamber 100. The gas distribution plate 2330 may diffuse the gas supplied from the upper portion. A plurality of gas introduction holes 342 (see FIG. 2) may be formed in the gas distribution plate 2330. The gas distribution plate 2330 may include a metallic material. For example, the gas distribution plate 2330 may be provided with an aluminum material. The gas distribution plate 2330 may be electrically grounded or connected with the upper power supply 630. The gas distribution plate 2330 may be grounded or connected with the upper power supply 630 to function as an upper electrode. In the exemplary embodiment, the upper portion of the gas distribution plate 2330 may be provided with a larger diameter than the lower portion. On the upper portion of the gas distribution plate 2330, a protrusion may be formed by a difference in diameter between the upper portion and the lower portion of the gas distribution plate 2330. The gas distribution plate 2330 may be supported to other configurations by the protrusion. In the exemplary embodiment, the gas distribution plate 2330 may be supported by the chamber 100. The shower head plate 2310 and the gas distribution plate 2330 are coupled to each other by the fastening member 380.

An upper surface 2315 of the shower head plate 2310 is in close contact with a lower surface 2345 of the gas distribution plate 2330. The lower surface 2345 of the gas distribution plate 2330 and the upper surface 2315 of the shower head plate 2310 are formed in concave or convex surfaces. In the exemplary embodiment, when the lower surface 2345 of the gas distribution plate 2330 is convex downward, the upper surface 2315 of the shower head plate 2310 is concave downward in response thereto. On the contrary, when the lower surface 2345 of the gas distribution plate 2330 is concave upward, the upper surface 2315 of the shower head plate 2310 is convex upward in response thereto. The shower head plate 2310 and the gas distribution plate 2330 have curved surfaces to be in close contact with each other, thereby maintaining the contact state therebetween even if the gas distribution plate 2330 and the shower head plate 2310 are deformed by the heat.

On the other hand, a heat transfer member 2350 may be further provided between the lower surface 2345 of the gas distribution plate 2330 and the upper surface 2315 of the showerhead plate 2310. The heat transfer member 2350 may facilitate the heat transfer between the gas distribution plate 2330 and the shower head plate 2310 and absorb the thermal deformation of the member and the thermal stress of the member generated by the heat. The heat transfer member 2350 may be provided with a silicon material containing ceramic and/or a silicon material containing metal.

The heat transfer member 2350 may be provided in a shape corresponding to the lower surface 2345 of the gas distribution plate 2330 and/or the upper surface 2315 of the showerhead plate 2310. The heat transfer member 2350 is provided with through holes corresponding to the gas introduction hole of the gas distribution plate 2330 and the gas supply hole of the shower head plate 2310 to prevent the flow of the gas from being interrupted. Subsequently, the substrate treating apparatus 1000 according to the exemplary embodiment of the present invention will be described with reference to FIG. 1. The gas supply unit 400 may supply process gas into the chamber 100. The gas supply unit 400 may include a gas supply nozzle 410, a gas supply line 420, and a gas storage unit 430. The gas supply nozzle 410 may be provided at the center of the upper surface of the chamber 100. An injection port is formed on the lower surface of the gas supply nozzle 410. The process gas supplied through the gas supply nozzle 410 passes through the gas distribution assembly 300 to supply the process gas to the treating space inside the chamber 100. The gas supply line 420 connects the gas supply nozzle 410 and the gas storage unit 430 to each other. The gas supply line 420 supplies the process gas stored in the gas storage unit 430 to the gas supply nozzle 410. The gas supply line 420 may be provided with a valve 421. The valve 421 opens and closes the gas supply line 420 and adjusts the flow rate of the process gas supplied through the gas supply line 420.

The gas supplied by the gas supply unit 400 may be excited in a plasma state by a plasma source. Further, the gas supplied by the gas supply unit 400 may be gas containing fluorine. For example, the gas supplied by the gas supply unit 400 may be tetrafluoromethane.

The plasma source excites the process gas in the chamber 100 in a plasma state. In the exemplary embodiment of the present invention, capacitively coupled plasma (CCP) is used as the plasma source. The CCP may include an upper electrode and a lower electrode inside the chamber 100. The upper electrode and the lower electrode may be vertically disposed in parallel to each other inside the chamber 100. Any one of both the electrodes applies high frequency power, and the other electrode may be grounded. An electric field is formed in a space between the both electrodes, and the process gas supplied to the space may be excited into the plasma state. A substrate W treating process is performed using this plasma. According to the exemplary embodiment, the upper electrode is provided as the gas distribution assembly 300, and the lower electrode may be provided in a combination of the body plate 230 and the RF support plate 270. The high frequency power is applied to the lower electrode, and the upper electrode may be grounded. Unlike this, the high frequency power may be applied to both the upper electrode and the lower electrode. As a result, an electromagnetic field is generated between the upper electrode and the lower electrode. The generated electromagnetic field excites the process gas provided inside the chamber 100 into a plasma state.

The liner unit (not illustrated) prevents the inner wall of the chamber 100 and the support unit 200 from being damaged during the process. The liner unit (not shown) prevents impurities generated in the process from being deposited on the inner wall and the support unit 200. The liner unit (not illustrated) includes an inner liner (not illustrated) and an outer liner (not illustrated).

The outer liner (not illustrated) is provided on the inner wall of the chamber 100. The outer liner (not illustrated) has a space with opened upper surface and lower surface. The outer liner (not illustrated) may be provided in a cylindrical shape. The outer liner (not illustrated) may have a radius corresponding to the inner surface of the chamber 100. The outer liner (not illustrated) is provided along the inner surface of the chamber 100. The outer liner (not illustrated) may be provided with an aluminum material. The outer liner (not illustrated) protects the inner surface of the chamber 100. An arc discharge may be generated inside the chamber 100 in a process in which the process gas is excited. The arc discharge damages the chamber 100. The outer liner (not illustrated) protects the inner surface of the chamber 100 to prevent the inner surface of the chamber 100 from being damaged by the arc discharge.

The inner liner (not illustrated) is provided to cover the support unit 200. The inner liner (not illustrated) is provided in a ring shape. The inner liner (not illustrated) is provided to cover the insulating cover 280. The inner liner (not illustrated) may be provided with an aluminum material. The inner liner (not illustrated) protects the outer surface of the support unit 200.

The exhaust baffle 500 is located between the inner wall of the chamber 100 and the support unit 200. The exhaust baffle 500 is provided in an annular ring shape. A plurality of through holes is formed in the exhaust baffle 500. The gas provided in the chamber 100 passes through the through holes of the exhaust baffle 500 and exhausted to the exhaust hole 104. The flow of the gas may be controlled according to the shape of the exhaust baffle 500 and the shapes of the through holes.

The controller (not illustrated) described above may control the overall operation of the substrate treating apparatus 1000. The controller (not illustrated) may include a central processing unit (CPU), a read only memory (ROM), and a random access memory (RAM). The CPU executes a desired process such as etching treatment, according to various recipes stored in its storage area.

In the recipe, as control information of the device for process conditions, a process time, a process pressure, high-frequency power or voltage, various gas flow rates, a temperature in the chamber (temperature of the electrode, temperature of the side wall of the chamber, temperature of the electrostatic chuck, etc.), a temperature of the cooler, and the like are input. On the other hand, the recipes representing these programs and treating conditions may be stored in a non-transitory computer readable medium. The non-transitory computer readable medium is not a medium that stores data therein for a while, such as a register, a cache, a memory, or the like, but means a medium that semi-permanently stores data therein and is readable by the machine. Specifically, various applications or programs described above may be stored and provided in the non-transitory computer readable medium, such as a CD, a DVD, a hard disk, a Blu-ray disk, a USB, a memory card, a ROM, or the like.

The foregoing detailed description illustrates the present invention. Further, the above content shows and describes the exemplary embodiment of the present invention, and the present invention can be used in various other combinations, modifications, and environments. That is, the foregoing content may be modified or corrected within the scope of the concept of the invention disclosed in the present specification, the scope equivalent to that of the disclosure, and/or the scope of the skill or knowledge in the art. Accordingly, the detailed description of the invention above is not intended to limit the invention to the disclosed exemplary embodiment. Further, the accompanying claims should be construed to include other exemplary embodiments as well. These modifications should not be understood individually from the technical idea and prospects of the present invention.

What is claimed is:

1. An apparatus for treating a substrate comprising:
   a chamber defining a treating space therein;
   a support unit configured to support the substrate in the treating space;
   a gas supply unit configured to supply gas to the treating space;
   a plasma source configured to generate plasma from the gas; and
   a gas distribution assembly disposed above the support unit, wherein the gas distribution assembly includes:
      a gas distribution plate formed with a plurality of gas introduction holes for diffusing the gas supplied from the gas supply unit;
      a shower head plate disposed in contact with an upper portion or a lower portion of the gas distribution plate and having a plurality of gas supply holes formed at positions communicating with the plurality of gas introduction holes; and
      a fastening member in contact with the gas distribution plate and the shower head plate to maintain adhesion between the gas distribution plate and the shower head plate, the fastening member including a first coupling portion inserted into a side surface of the gas distribution plate and coupled to the gas distribution plate, and a second coupling portion supporting the lower surface of the shower head plate,
      wherein the gas distribution plate and the shower head plate have different thermal expansion coefficients.

2. The apparatus for treating the substrate of claim 1, wherein the fastening member is made of metal or ceramic or engineering plastic having elasticity and heat resistance.

3. The apparatus for treating the substrate of claim 1, wherein the gas distribution plate and the first coupling portion of the fastening member are screwed to each other.

4. The apparatus for treating the substrate of claim 1, wherein the gas introduction holes of the gas distribution plate and the gas supply holes communicating with the gas introduction holes in the shower head plate are provided at communicating positions even in deformation due to the thermal expansion of the gas distribution plate and the shower head plate generated according to the substrate process.

5. The apparatus for treating the substrate of claim 4,
wherein the diameter of the gas introduction hole is provided greater than the diameter of the gas supply hole.

6. The apparatus for treating the substrate of claim 5,
wherein the plurality of gas supply holes communicates with one of the plurality of gas introduction holes.

7. The apparatus for treating the substrate of claim 4,
wherein the plurality of gas supply holes communicates with one of the plurality of gas introduction holes.

8. The apparatus for treating the substrate of claim 1, further comprising:
a ring-shaped cover member located on the lower surface of the fastening member to cover a surface where the fastening member is exposed to the treating space.

9. The apparatus for treating the substrate of claim 1,
wherein the gas distribution plate is made of a material containing metal, and
wherein the shower head plate is made of a material which reacts with plasma generated from the gas supplied by the gas supply unit to generate a compound.

10. The apparatus for treating the substrate of claim 1, further comprising:
a heat transfer member provided between the gas distribution plate and the shower head plate and provided in a shape corresponding to the lower surface of the gas distribution plate or the upper surface of the shower head plate,
wherein the heat transfer member is made of a silicon material containing at least one of ceramic or metal.

11. The apparatus for treating the substrate of claim 1,
wherein in the gas distribution plate, a surface in contact with the shower head plate is formed as any one of a concave surface and a convex surface, and
wherein in the shower head plate, a surface in contact with the gas distribution plate is formed as the other surface of the concave surface and the convex surface.

12. A gas distribution assembly provided in an apparatus for treating a substrate with plasma to distribute gas, the gas distribution assembly comprising:
a gas distribution plate formed with a plurality of gas introduction holes for diffusing the gas supplied from the gas supply unit;
a shower head plate disposed at the upper portion or lower portion of the gas distribution plate to be in contact with the gas distribution plate and having a plurality of gas supply holes formed at positions communicating with the gas introduction holes to penetrate through the upper surface and the lower surface; and
a fastening member in contact with the gas distribution plate and the shower head plate to maintain adhesion between the gas distribution plate and the shower head plate, and including a first coupling portion inserted into a side surface of the gas distribution plate and coupled to the gas distribution plate, and a second coupling portion supporting the lower surface of the shower head plate,
wherein the gas distribution plate and the shower head plate have different thermal expansion coefficients.

13. The gas distribution assembly of claim 12,
wherein the gas distribution plate is made of a material containing metal.

14. The gas distribution assembly of claim 12,
wherein the fastening member is made of metal or ceramic or engineering plastic having elasticity and heat resistance.

15. The gas distribution assembly of claim 12,
wherein the gas distribution plate and the first coupling portion of the fastening member are screwed to each other.

16. The gas distribution assembly of claim 12,
wherein the gas introduction holes of the gas distribution plate and the gas supply holes communicating with the gas introduction holes in the shower head plate are provided at communicating positions even in deformation due to the thermal expansion of the gas distribution plate and the shower head plate generated according to the substrate process.

17. The gas distribution assembly of claim 16,
wherein the diameter of the gas introduction hole is provided greater than the diameter of the gas supply hole.

18. The gas distribution assembly of claim 12, further comprising:
a heat transfer member provided between the gas distribution plate and the shower head plate and provided in a shape corresponding to the lower surface of the gas distribution plate or the upper surface of the shower head plate,
wherein the heat transfer member is made of a silicon material containing at least one of ceramic or metal.

19. The gas distribution assembly of claim 12,
wherein in the gas distribution plate, a surface in contact with the shower head plate is formed as any one of a concave surface and a convex surface, and
wherein in the shower head plate, a surface in contact with the gas distribution plate is formed as the other surface of the concave surface and the convex surface.

20. An apparatus for treating a substrate comprising:
a chamber configured to have a treating space therein;
a support unit configured to support the substrate in the treating space;
a gas supply unit configured to supply gas to the treating space;
a plasma source configured to generate plasma from the gas; and
a gas distribution assembly disposed above the support unit,
the gas distribution assembly includes
a gas distribution plate made of a metallic material, configured to diffuse the gas supplied from the gas supply unit, and formed with a plurality of gas introduction holes;
a shower head plate made of a material containing silicon, disposed at the lower portion of the gas distribution plate to be in contact with the gas distribution plate, and having a plurality of gas supply holes formed at positions communicating with the gas introduction holes to penetrate through the upper surface and the lower surface; and
a fastening member in contact with the gas distribution plate and the shower head plate, made of metal or ceramic or engineering plastic having elasticity and heat resistance, and including a first coupling portion inserted into a side surface of the gas distribution plate and then screwed with the gas distribution plate, a second coupling portion supporting the lower surface of the shower head plate, and a connection portion connecting the first coupling portion and the second coupling portion,
wherein the fastening member is provided to maintain adhesion between the gas distribution plate and the shower head plate, wherein the gas introduction holes of the gas distribution plate and the gas supply holes communicating with the gas introduction holes in the shower head plate are provided at communicating positions even in deformation due to the thermal expansion of the gas distribution plate and the shower head plate generated according to the substrate process.

* * * * *